United States Patent [19]

Suzuki et al.

[11] Patent Number: 5,576,713
[45] Date of Patent: Nov. 19, 1996

[54] COMPENSATION CIRCUIT FOR IMPROVING MODULATION CHARACTERISTIC, AND MODULATOR AND RADAR EQUIPMENT USING THE SAME

[75] Inventors: Hiroshi Suzuki, Kawasaki; Masayoshi Shono, Kobe, both of Japan

[73] Assignees: Fujitsu Limited; Fujitsu Ten Limited, both of Japan

[21] Appl. No.: 442,201

[22] Filed: May 16, 1995

[30] Foreign Application Priority Data

Jul. 4, 1994 [JP] Japan .................................. 6-174715

[51] Int. Cl.[6] ............................................... G01S 7/40
[52] U.S. Cl. ........................... 342/174; 342/203; 342/204
[58] Field of Search .............................. 342/165, 173, 342/174, 202, 203, 204

[56] References Cited

U.S. PATENT DOCUMENTS

| | | | |
|---|---|---|---|
| 3,905,034 | 9/1975 | Jensen et al. | 342/110 |
| 3,952,302 | 4/1976 | Mullins | 342/161 |
| 4,083,049 | 4/1978 | Mattern et al. | 342/28 |
| 4,123,726 | 10/1978 | Schucht | 331/14 |
| 4,171,514 | 10/1979 | Faxon | 325/121 |

FOREIGN PATENT DOCUMENTS 61-224706  10/1986  Japan .

*Primary Examiner*—John B. Sotomayor
*Attorney, Agent, or Firm*—Greer, Burns & Crain, Ltd.

[57] ABSTRACT

A differential gain characteristic can be equivalently improved by providing a compensation circuit. The compensation circuit compensates a differential gain of a voltage-controlled oscillator, of which oscillating frequency is controlled by a control voltage. The compensation circuit comprises a first resistor which is connected to an input side of the voltage-controlled oscillator in series and a series circuit of a second resistor and a first diode, which is connected to the input side of the voltage-controlled oscillator in parallel, and further a first bias electric source for giving a bias voltage to the first diode in a forward direction. It becomes possible to make DG to be less than 5%, even if a modulator having a larger slope of characteristic, such as DG<50%.

19 Claims, 11 Drawing Sheets

FIG. 1
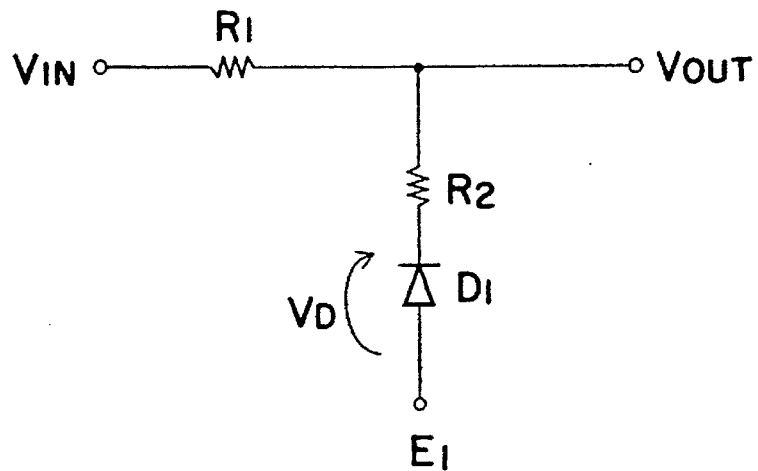
FIG. 2A
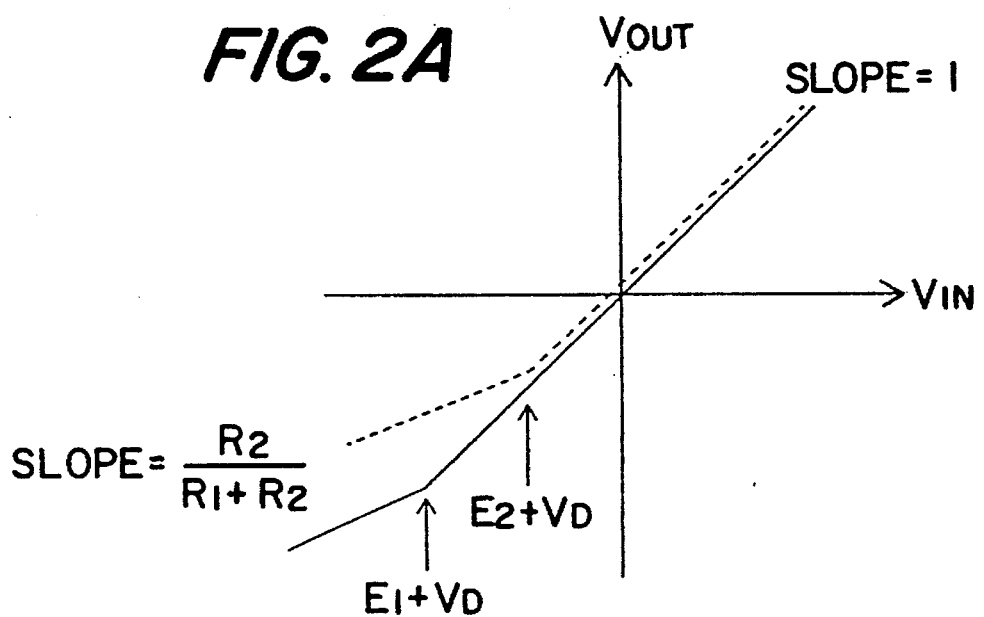
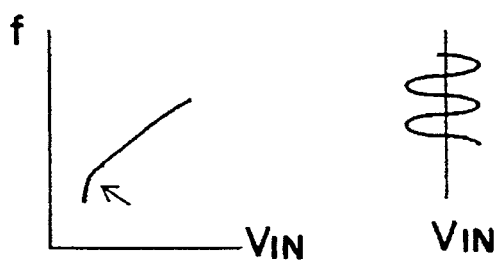
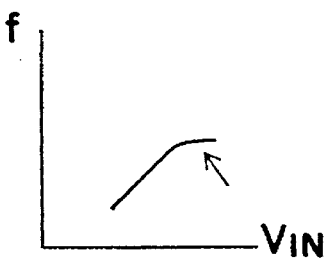
FIG. 2B    FIG. 2C

GENTLE-CURVED COMPENSATION

SHARP-CURVED COMPENSATION

CHARACTERISTIC AFTER COMPOSING

CHARACTERISTIC OF VCO MODULATOR

CHARACTERISTIC OF COMPENSATOR

1

COMPENSATION CIRCUIT FOR IMPROVING MODULATION CHARACTERISTIC, AND MODULATOR AND RADAR EQUIPMENT USING THE SAME

BACKGROUND OF THE INVENTION

1. Field of the Invention

The present invention relates to a compensation circuit for improving a modulation characteristic of a modulator. More particularly, it relates to a compensation circuit, which can equivalently improve a differential gain characteristic of a modulator, and the modulator and radar equipment using the same.

2. Description of the Related Art

In radio apparatuses for transmitting FM signals or FM-CM (Continuous Wave) radars, it is required that a differential gain (DG) of an FM modulator be small. To fulfill the requirement, a conventional circuit has obtained a suitable DG by controlling constants of high-frequency circuits of the modulator as a first example, or the circuit has equivalently improved the DG by modifying a base band waveform, which is added to the modulator in a compensation circuit as a second example.

However, it has become more difficult to control the constants if a oscillating frequency in the modulator is within a micro wave band or millimeter wave band in the above-described first example.

The above-described second example will be explained in accordance with FIGS. 21A through 21C. Throughout FIGS. 21A through 21C, a compensation circuit 1 modifies a base band signal. FIG. 21A shows the compensation circuit and its compensation characteristic.

FIG. 21B shows a voltage-controlled oscillator 2, in which an output frequency f is varied according to control electric voltage $V_T$, and its input/output characteristic. Hereinafter, a percentage of variation of modulation sensitivity, i.e., $DG=(kV_0-kV_1/kV_0)$ is referred to as a differential gain in the input/output characteristic of the voltage-controlled oscillator 2. $kV_0$ and $kV_1$ show modulation sensitivities.

If the voltage-controlled oscillator 2 has an ideal characteristic, the relation between the control voltage $V_T$ and the output frequency f has a linear characteristic, and the differential gain becomes 0.

In the case where the input/output characteristic of the voltage-controlled oscillator 2 shows a non-linearity as shown in FIGS. 21B, a characteristic of the compensation circuit 1 should be reversed to the input/output characteristic of the voltage-controlled oscillator 2, as shown in FIGS. 21A. Further, the compensation circuit 1 is connected to the voltage-controlled oscillator 2 in series, as shown in FIG. 21C. Therefore, the relation between the input $V_{in}$ and the output frequency f has a linear characteristic after composing the input/output characteristic of the voltage-controlled oscillator 2 and the characteristic of the compensation circuit 1, so that the differential gain can be improved.

Accordingly, if the characteristic of the compensation circuit 1 is reversed to the input/output characteristic of the voltage-controlled oscillator 2, it is possible to obtain the characteristic having a suitable linearity after composing. FIGS. 22 and 24 show structures of the conventional compensation circuit 1. Further, FIGS. 23 and 25 show characteristics of the structures, respectively.

The compensation circuit shown in FIG. 22 is disclosed in Japanese Unexamined Patent Publication No. 20004/1982. The compensation circuit is composed of a diode $D_1$ inserted between input and output sides in a forward direction, a variable resistor $R_v$ connected to the diode $D_1$ in parallel, and a resistor R connected to the output side in parallel.

A bending line characteristic obtained in this circuit is employed to bring the characteristic close to an inverse characteristic of the input/output characteristic of the voltage-controlled oscillator 2. FIG. 23 shows a characteristic which is close to the inverse characteristic of the input/output characteristic. This circuit, has a drawback drawback that a bending point is varied as $B_{p1}$, to $B_{p3}$, as shown in the diagram, when a desired bending line characteristic is obtained, according to the size of the resistor R.

Figure 25:
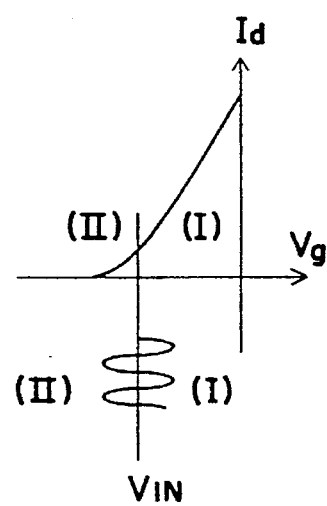
FIG. 25 shows a $V_g$-$I_d$ characteristic of a gate voltage $V_g$ and a drain current $I_d$ of the FET. The circuit shown in FIG. 24 compensates the input/output characteristic of the voltage-controlled oscillator 2 by employing a non-linearity section of the $V_g$-$I_d$ characteristic.

However, in the $V_g$-$I_d$ characteristic shown in FIG. 25, a percentage of non-linearity in an area (II) is larger than that in an area (I). Therefore, the $V_g$-$I_d$ characteristic in the area (II) is largely changed by the input $V_{in}$, and the characteristic does not change in the area (I).

Accordingly, it is possible to compensate the characteristic in the area (II) in which the control voltage is small for the output of the voltage-controlled oscillator 2. However, there is a drawback that it is not possible to compensate the characteristic for the area (I) in which the control voltage is large.

SUMMARY OF THE INVENTION

Accordingly, it is an object of the present invention to provide a compensation circuit to overcome the drawbacks in the conventional circuits.

It is another object of the present invention to provide a compensation circuit which can easily control a differential gain, even if an oscillating frequency band of a modulator is a micro wave band or a millimeter wave band.

It is a still another object of the present invention to provide a compensation circuit which can improve a differential gain of a voltage-controlled oscillator.

It is a further object of the present invention to provide a compensation circuit which can perform even a minute compensation, such as to improve a differential characteristic of a modulator having an extent of suitable differential characteristic.

Yet a further object of the present invention to provide a modulator having a compensation circuit to attain the above-described objects according to the present invention.

It is a more specific object of the present invention to provide radar equipment in which a modulator having a compensation circuit is provided to attain the above-described objects according to the present invention.

It is a further object of the present invention to provide a compensation circuit connected to an input side of a voltage-controlled oscillator of which the output frequency is controlled by a control voltage for compensating a differential gain of the voltage-controlled oscillator.

An object of the present invention to provide a compensation circuit comprising a first resistor connected to an input side of a voltage-controlled oscillator in series, a series circuit of a second resistor and a first diode connected to the input side of the voltage-controlled oscillator in parallel, and further, a first bias electric source for giving a bias voltage to the first diode in a forward direction.

A further object of the present invention to provide a modulator comprising a voltage-controlled oscillator of which an oscillating frequency is controlled by a control voltage and a compensation circuit connected to an input side of the voltage-controlled oscillator, wherein the compensating circuit includes a first resistor connected to the input side of the voltage-controlled oscillator in series, a series circuit of a second resistor and a first diode connected to the input side of the voltage-controlled oscillator in parallel, and further, a first bias electric source for giving a bias voltage to the first diode in forward direction.

A still further object of the present invention to provide radar equipment comprising a modulation signal generator for outputting a modulation signal having a triangular waveform, an oscillator for generating an oscillating signal of a frequency according to a size of the modulation signal outputted from the modulation signal generator, an antenna for sending the oscillating signal outputted from the oscillator via a directional coupler, an antenna for receiving a reflected signal for the oscillating signal radiated from the sending antenna, a mixer for mixing a reflected signal received from the receiving antenna and the oscillating signal outputted from the oscillator, which is branched from the directional coupler and outputting a beat signal corresponding to a difference of frequencies between the both signals to judge a generated position and relative velocity of the reflected signal according to a frequency of a beat signal outputted from the mixer.

Further, other objects of the present invention become clear by the description for explaining embodiments according to the attached drawings and the claims.

BRIEF DESCRIPTION OF THE INVENTION

FIG. 1 is a diagram showing the first embodiment according to the present invention.

FIGS. 2A to 2C are explanatory diagrams of the characteristic of the first embodiment.

Figure 3:
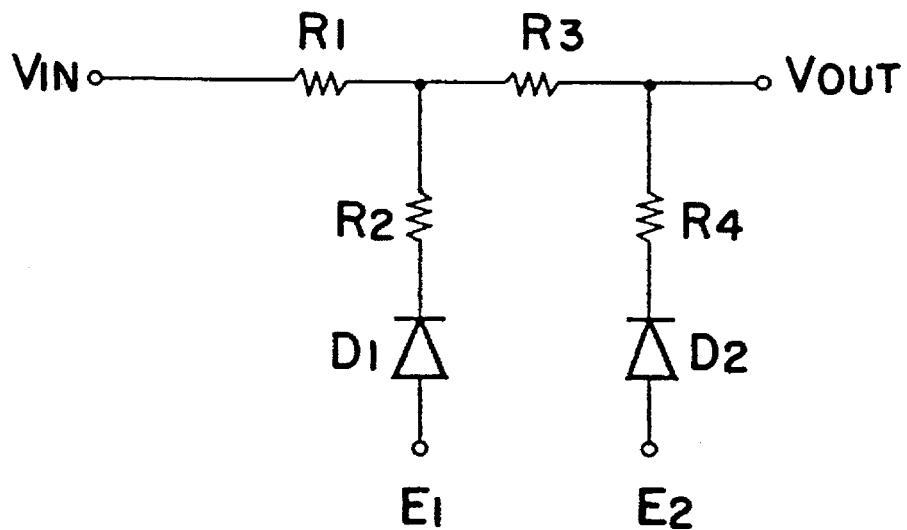

FIG. 3 is a diagram showing the second embodiment according to the present invention.

Figure 4:
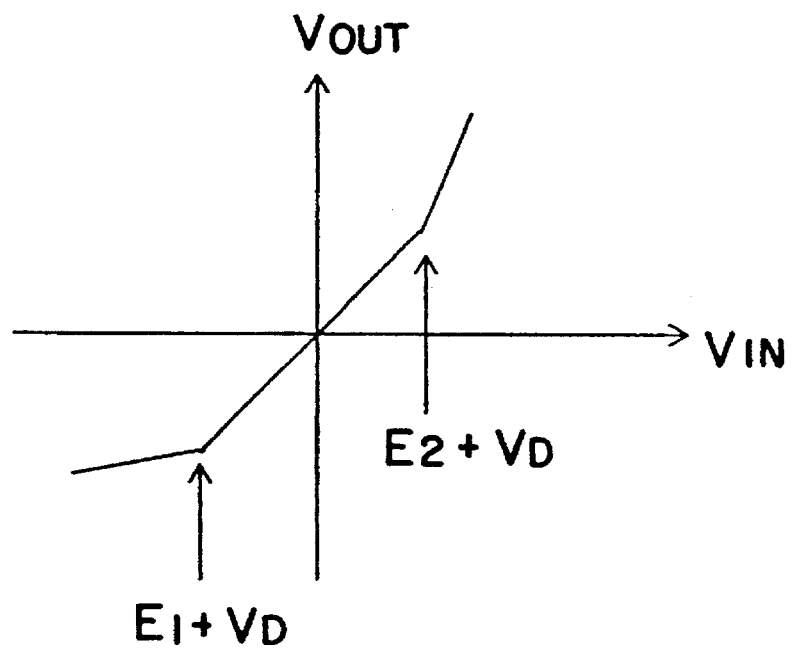

FIG. 4 is an explanatory diagram of the characteristic of the second embodiment.

Figure 5:
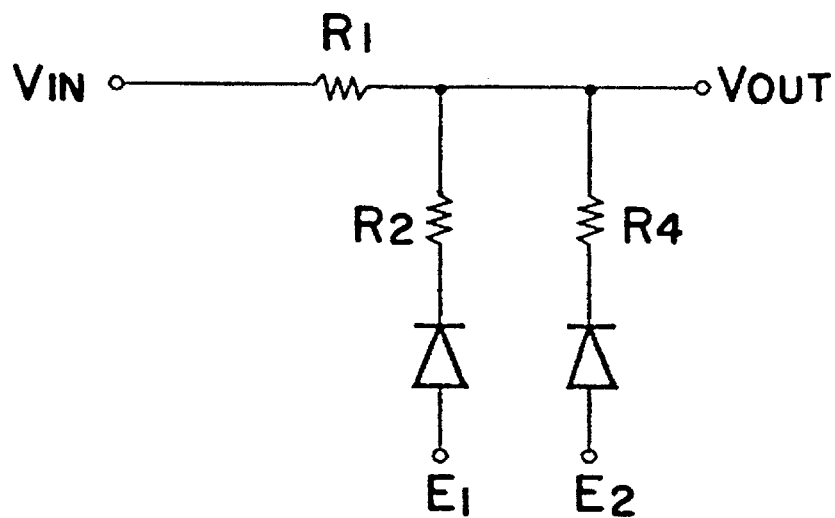

FIG. 5 is a diagram showing the third embodiment according to the present invention.

FIGS. 6A to 6D are diagrams showing the fourth embodiment according to the present invention and its characteristic.

Figure 7:
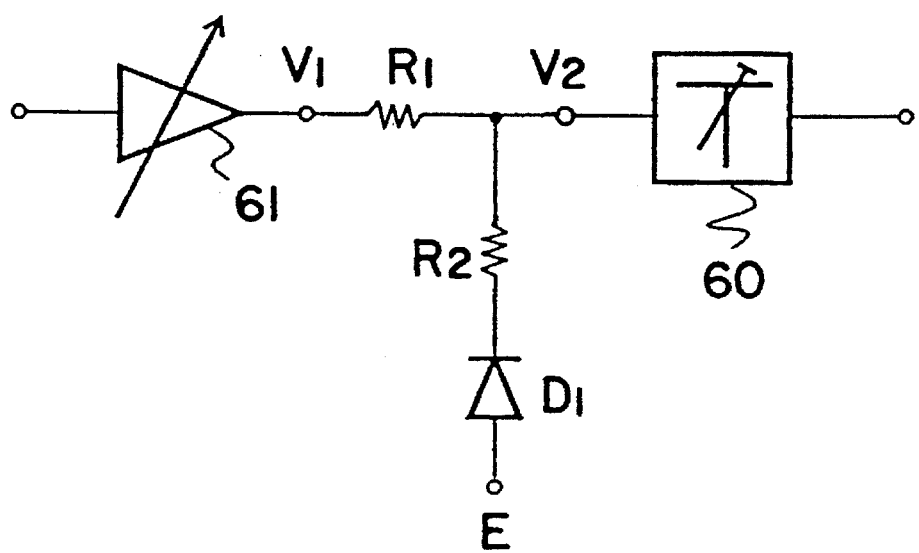

FIG. 7 is a diagram showing the fifth embodiment according to the present invention.

Figure 8:
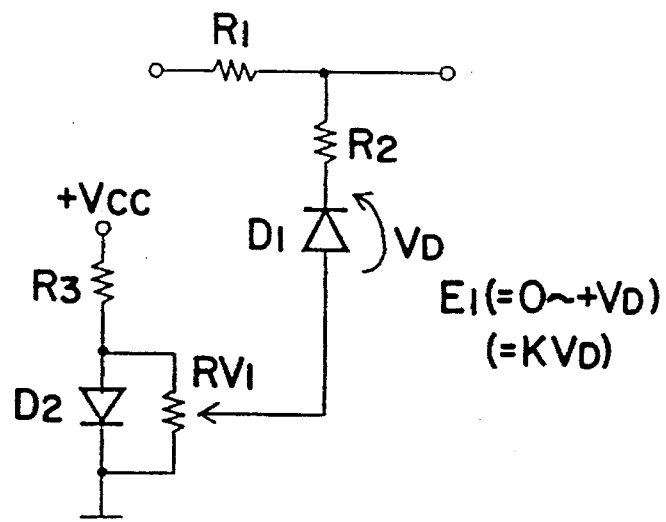

FIG. 8 is a diagram showing the sixth embodiment according to the present invention.

Figure 9:
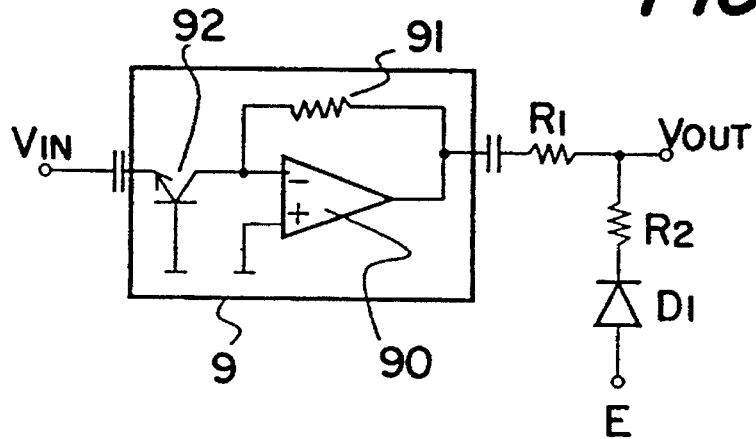

FIG. 9 is a diagram showing the seventh embodiment according to the present invention.

Figure 10:
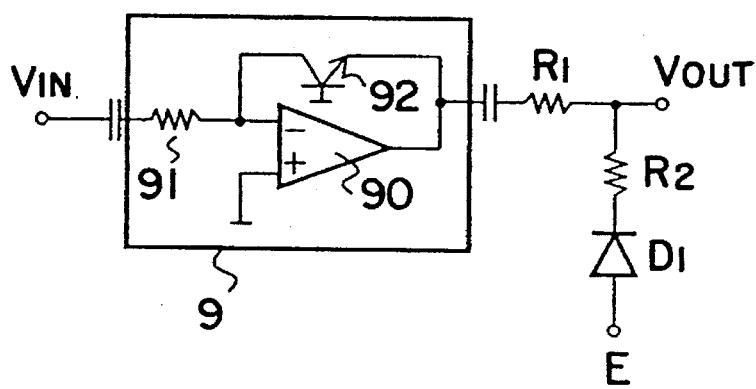

FIG. 10 is a diagram showing the eighth embodiment according to the present invention.

Figure 11:
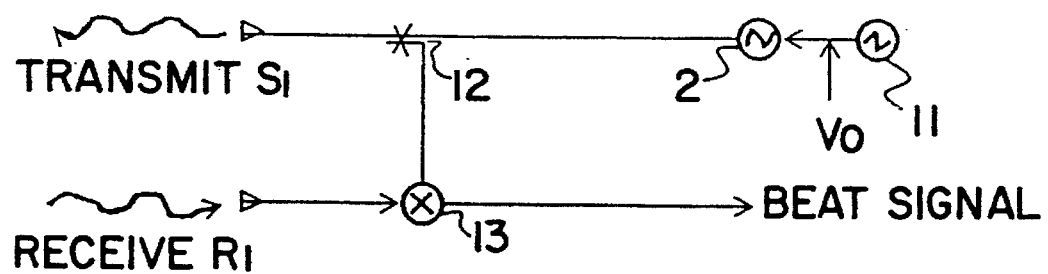

FIG. 11 is an explanatory diagram of an applied example of a compensation circuit according to the present invention.

Figure 12:
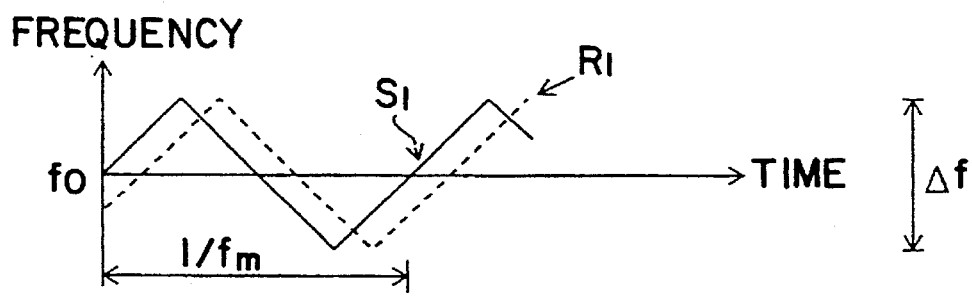

FIG. 12 is an explanatory diagram of an operation in frequency variation of a signal of FIG. 11.

Figure 13:
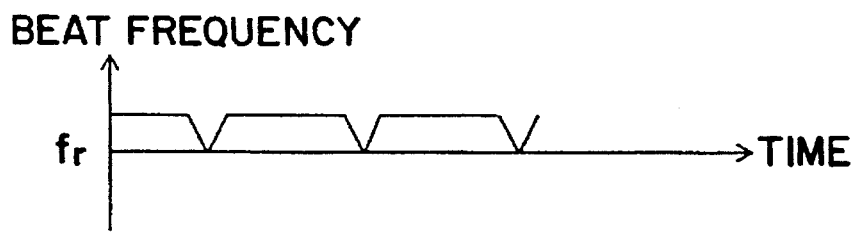

FIG. 13 is an explanatory diagram of an operation in variation of a beat frequency of FIG. 11.

Figure 14:
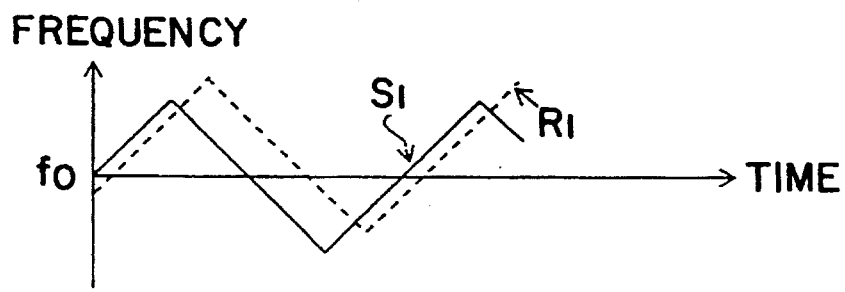

FIG. 14 is an explanatory diagram of an operation in transmitted signal at the time of a relative velocity of FIG. 11.

Figure 15:
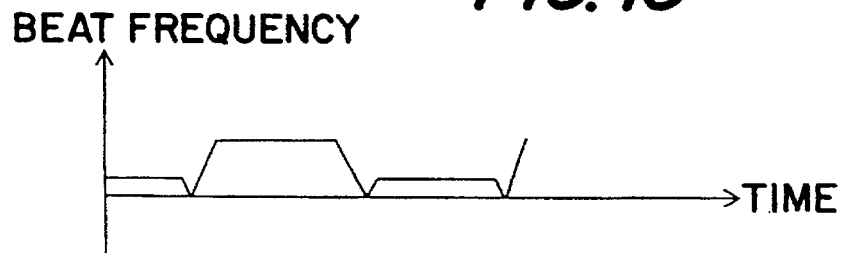

FIG. 15 is an explanatory diagram of an operation in variation of a beat frequency of FIG. 14.

Figure 16:
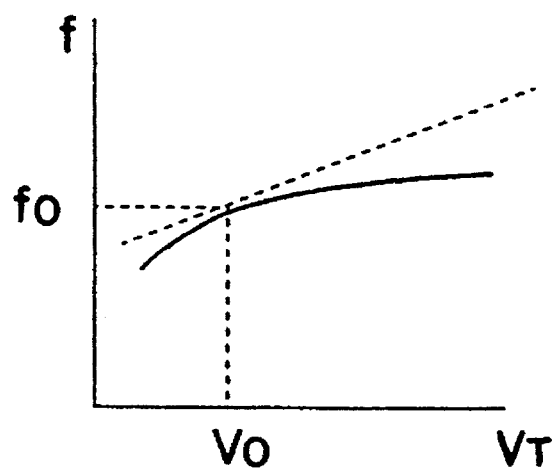

FIG. 16 is an explanatory diagram of non-linearity of an oscillator.

Figure 17:
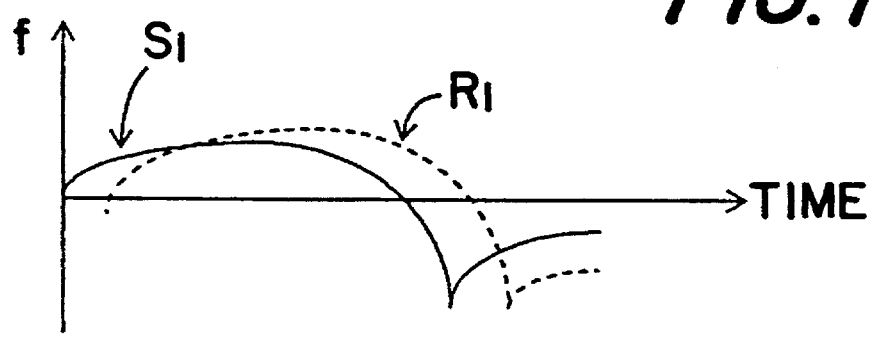

FIG. 17 is a diagram showing variation of frequency of a transmitted signal based on a characteristic shown in FIG. 16.

Figure 18:
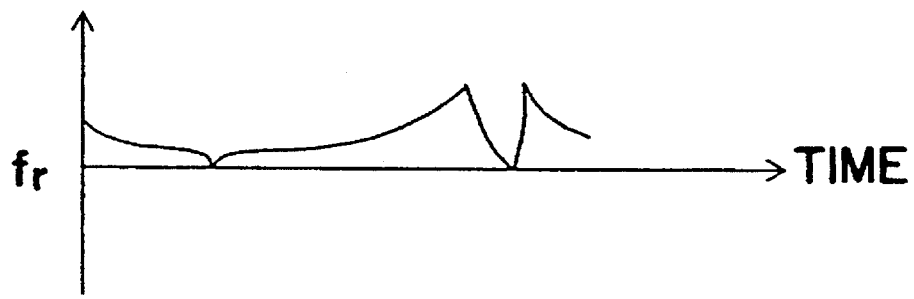

FIG. 18 is a diagram showing variation of beat frequency based on a characteristic shown in FIG. 16.

Figure 19:
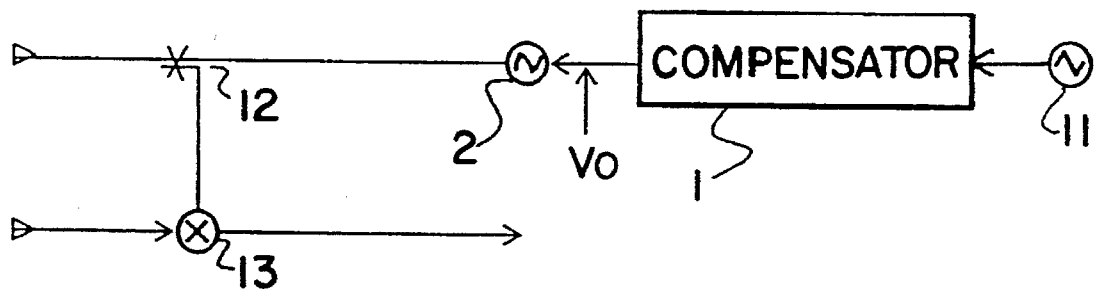

FIG. 19 is a diagram showing a structure of radar equipment applying a compensation circuit according to the present invention.

Figure 20:
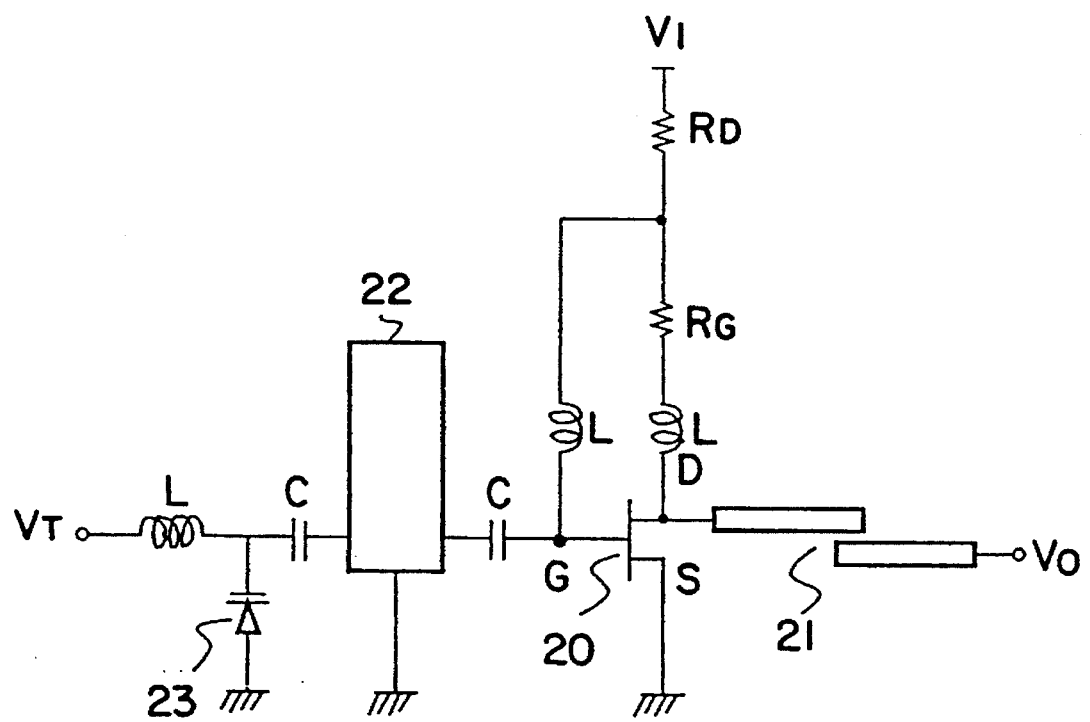

FIG. 20 is a diagram showing a structural circuit of an oscillator showing non-linearity.

Figure 21C:
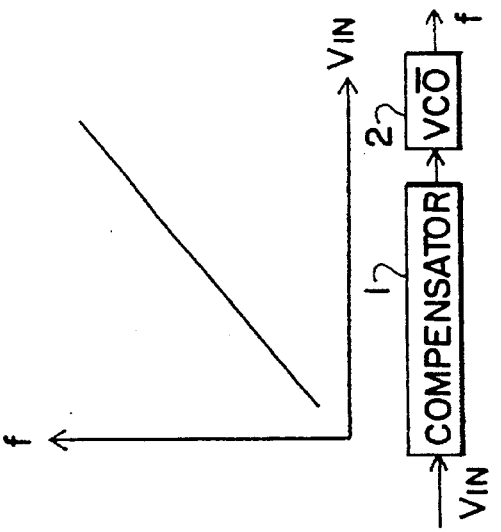
Figure 21B:
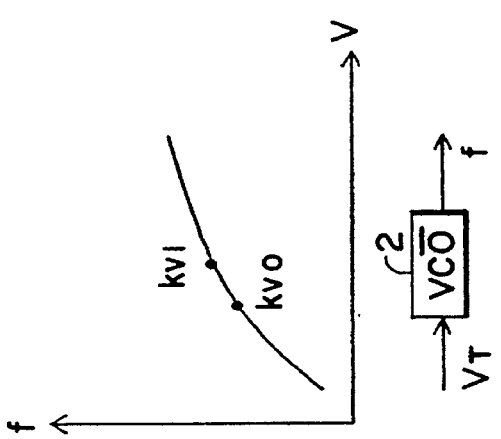
Figure 21A:
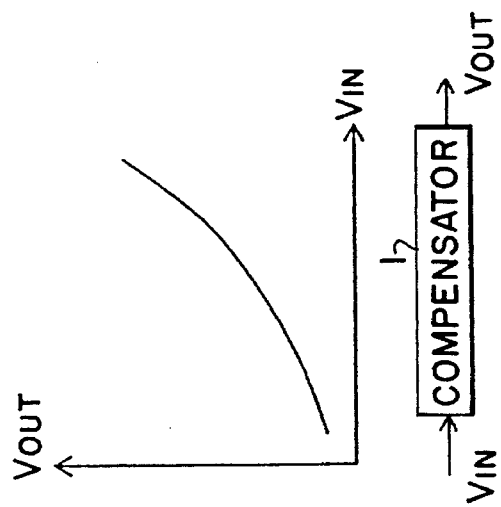

FIGS. 21A to 21C are respectively diagrams for explaining a function of a compensation circuit.

Figure 22:
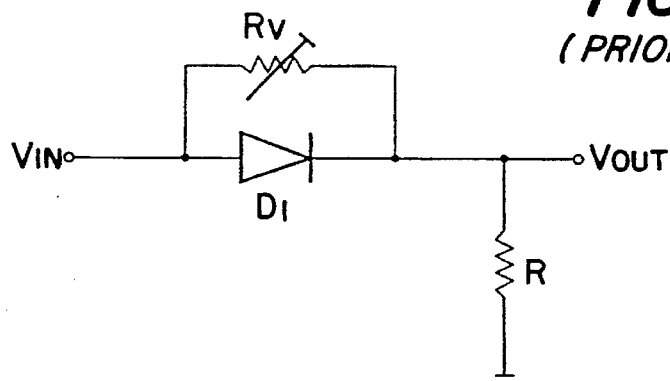

FIG. 22 is a diagram showing the first conventional circuit.

Figure 23:
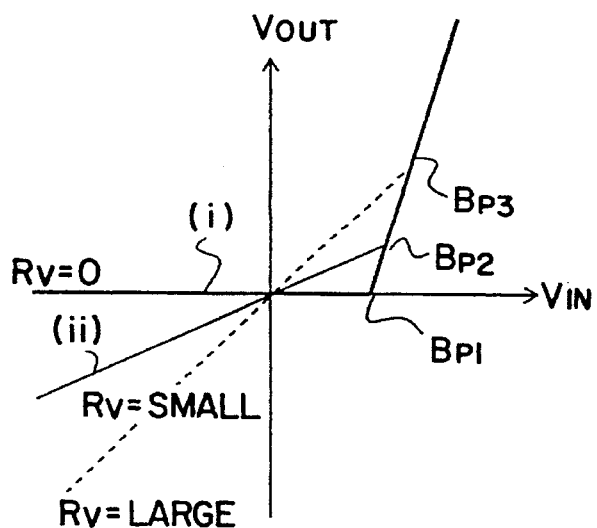

FIG. 23 is a diagram for explaining a characteristic of the first conventional circuit.

Figure 24:
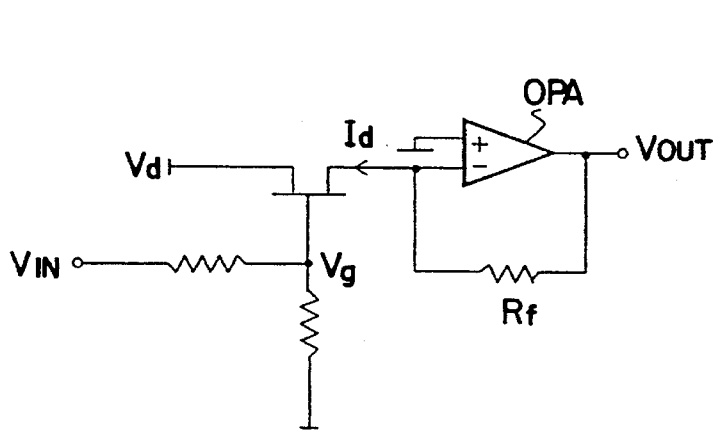
FIG. 24 shows a circuit which is disclosed in Japanese Unexamined Patent Publication No. 224706/1986. The circuit is composed of an operational amplifier OPA having a feedback resistor $R_f$ and a FET connected to an input side of the feedback resistor $R_f$.

FIG. 24 is a diagram showing the second conventional circuit.

FIG. 25 is a diagram for explaining a characteristic of the second conventional circuit.

DESCRIPTION OF THE PREFERRED EMBODIMENTS

The preferred embodiments of the present invention will be explained in accordance with the attached drawings. Throughout the following descriptions, the same reference numerals in the drawings are used to denote and identify corresponding or identical components.

FIG. 1 shows a first embodiment of a compensation circuit according to the present invention. A compensation circuit shown in FIG. 1 connected to an input side of a voltage-controlled oscillator 2, in which the oscillating output frequency is controlled by a control voltage compensates a differential gain of the voltage-controlled oscillator 2 (Refer to FIG. 21C).

The compensation circuit according to the present invention comprises a first resistor R connected to an input side $V_T$ of the voltage-controlled oscillator 2 in series and a series circuit of a second resistor $R_2$ and a first diode $D_1$ connected to the input side $V_T$ of the voltage-controlled oscillator 2 in parallel.

Further, a first bias source E, is connected to the first diode $D_1$ for giving a bias voltage in the forward direction of the first diode $D_1$.

In FIG. 1, if an input voltage $V_{in}$ increases enough, the diode $D_1$ is inversely biased and becomes open. Accordingly, an output voltage $V_{out}$ becomes equal to the input voltage $V_{in}$.

Meanwhile, if the input voltage $V_{in}$ decreases for the bias source $E_1$, to the level of that the diode $D_1$ becomes conductive, i.e., $V_{in}$, $<E_1+V_d$ ($V_d$ is a voltage drop in a forward direction of the diode $D_1$), the value of the resistor $R_2$ cannot be ignored.

The output voltage $V_{out}$ is an output of the function having a slope defined by $R_2/(R_1+R_2)$, as shown in FIG. 2A.

Then, a value of the resistor $R_1$ can be small enough in comparison with that of the resistor $R_2$. Therefore, the slope can become approximately 1, and it becomes possible to employ the compensation circuit which can improve an acceptable DG has than 30% to a preferable DG less than 5%, for example, a preferable DG, which is smaller than 5%.

Further, there is no relation between a combination of the resistors $R_1$ and $R_2$ and the variation of the size of bias source $E_1$, so that a bending point (i.e., positions of $E_1+V_D$, $E_2+V_D$) can be changed as shown in FIG. 2A. Furthermore, the slope can be changed according to the combination of resistors $R_1$ and $R_2$, so that any sharp slope can be compensated at any position of a modulation characteristic, as shown in FIGS. 2B and 2C.

FIG. 3 shows a circuit of a second embodiment according to the present invention. In this embodiment, the compensation circuit has a double-structure of the circuit of the first embodiment. That is, the circuit is composed of two stages of the circuit of the first embodiment and an additional same circuit. Namely, the circuit of the first embodiment, which includes the resistors $R_1$ and $R_2$ and the bias source $E_1$, is connected to the additional same circuit, which includes resistors $R_3$ and $R_4$ and a bias source $E_2$. Size of the bias source $E_2$ is different from that of the bias source $E_1$.

Accordingly, the bending points are simultaneously formed on two points as shown in FIG. 4, so that it becomes possible to perform more complex compensation.

FIG. 5 shows a circuit of the third embodiment. This circuit is made by removing the resistor $R_3$ from the circuit shown in FIG. 3. In this case, if the resistor $R_2$ is different from the resistor $R_4$, and the bias source $E_1$ is different from the bias source $E_2$, it becomes possible to give the same effectiveness as that in the embodiment shown in FIG. 3.

Figure 6A:
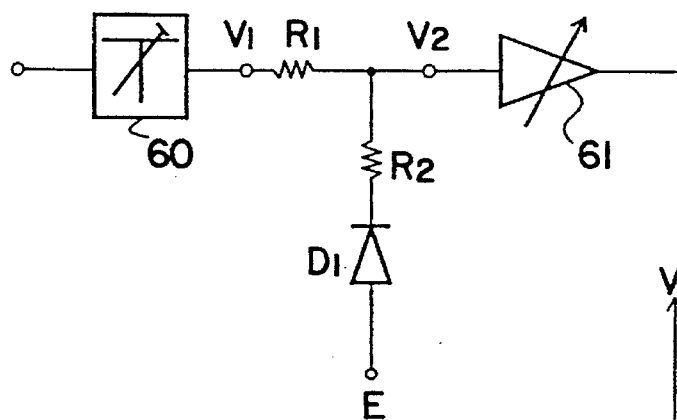

FIGS. 6A to 6D are diagrams showing circuits and characteristic of the fourth embodiment according to the present invention. FIG. 6A is a compensation circuit of the fourth embodiment. The circuit is formed of an attenuator 60 which is connected to an input side of a compensation circuit of the first embodiment including the resistors $R_1$ and $R_2$ and the bias source $E_1$, and further, a variable-gain amplifier 61 which is connected to the output side of the compensation circuit.

Figure 6B:
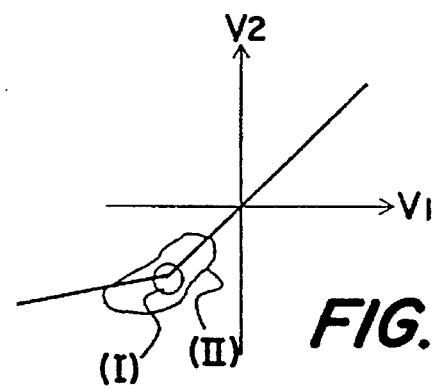
Figure 6C:
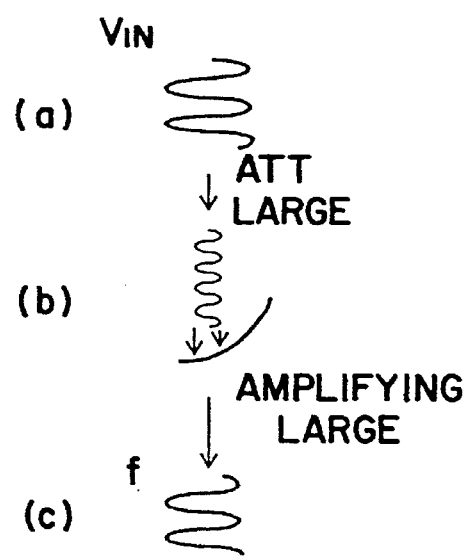
Figure 6C:
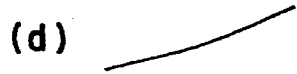
Figure 6D:
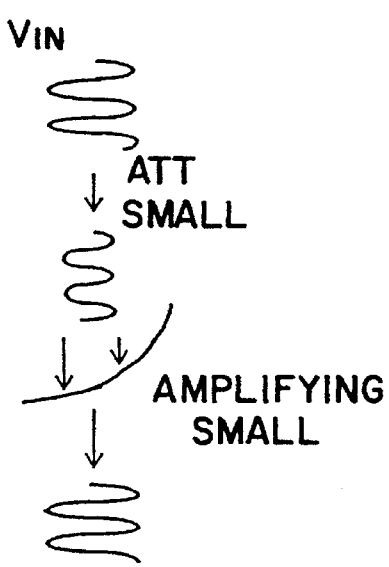
Figure 6D:

A specific point of the fourth embodiment is to give a compensation characteristic as shown in FIG. 6C for a relatively gentle-curved portion of the modulator, in the case where only neighborhood of the bending point as indicated in (I) of FIG. 6B, of a characteristic of the compensation circuit is employed as a compensating characteristic. Reversely, in the case where a wider range including the neighborhood of the bending point as indicated in (II) of FIG. 6B, of the characteristic of the compensation circuit is employed as a compensating characteristic, a compensating characteristic is given for a relatively sharp-curved portion of the modulator as shown in FIG. 6D.

Therefore, in the case where the neighborhood of the bending point (I) of FIG. 6B is employed, a larger attenuation amount (b) of FIG. 6C is given to a control input (a) by the attenuator 60, as shown in FIG. 6C. Accordingly, the input signal of the compensation circuit varies at the neighborhood of bending point. Further, the amplifier 61 amplifies the attenuated control input to be the original level with a large amplifying gain.

Meanwhile, in the case where the wider range including the neighborhood of the bending point (II) of FIG. 6B is employed as a compensating characteristic, a smaller attenuation amount (b) is given to the control input (a) by the attenuator 60. Therefore, the input signal of the compensation circuit varies within the wider range including neighborhood of the bending point.

The amplifier 61 is controlled so as to amplify the control signal passing through the compensation circuit at a relatively smaller amplifying gain.

FIG. 7 shows a circuit of the fifth embodiment according to the present invention. In FIG. 7, the circuit has an attenuator 60 and an amplifier which are positioned in reverse to those shown in FIG. 6A in relation to the input and output of the compensation circuit, according to the principle of FIG. 6A. As the operation is the same as that explained in FIGS. 6A through 6D, even if the attenuation and amplifying are reversed to those shown in FIG. 6A, the explanation of the operation will be abbreviated here.

FIG. 8 shows a circuit of the sixth embodiment according to the present invention. This circuit is formed with due regard to a temperature compensation in comparison with the circuit shown in FIG. 1. That is, in the circuit shown in FIG. 1, the diode Di has a temperature characteristic, and even if there is no temperature variation in the bias source $E_1$, the forward direction voltage $V_D$ changes with the slope (−2.3 mV/deg) by the environmental temperature according to the temperature characteristic of the diode $D_1$.

Accordingly, the voltage at the bending points varies as much as 0.18 V between the high temperature (70° C.) and the low temperature (−10° C.). To suppress the variation to the utmost, the bias source $E_1$, is limited within the range of 0 to $+V_D$ and obtained from the diode $D_2$ having the same temperature characteristic as that of the diode $D_1$.

In FIG. 8, a series circuit of the resistor $R_3$ and the diode $D_1$ connected to the voltage $V_{CC}$, and the variable resistor $R_{VI}$ are provided to the diode $D_2$ in parallel. The source $E_1$ is obtained by dividing the forward direction voltage $V_D$ of the diode $D_2$.

If the source $E_1=k \times V_D$, the voltage of the bending point becomes $(k-1) V_D$, and the temperature slope is compressed to $(k-1)$.

For example, in a modulator employing a 30 GHz strip line resonant type voltage controlled oscillator, $V_D=0.72$ V, and $E_1$ is 0.5 V or its neighborhood. In the case of employing the circuit according to the present invention, it is possible to compress the variation due to the temperature of the voltage of the bending point to be nearly one-third, i.e., from 0.18 V to 0.05 V.

FIGS. 9 and 10 show circuits of the seventh and eight embodiments according to the present invention. Both circuits have amplifiers 9 on the previous stage of the compensation circuit shown in FIG. 1.

The amplifier shown in FIG. 9 includes a transistor 92 having its base is connected to the ground and its collector connected to the input side of an operational amplifier 90 and a feed back resistor 91 of the operational amplifier 90. The amplifier has an anti-log characteristic. The amplifier 9 shown in FIG. 10 includes a transistor 92 having its base connected to the ground and which is provided in the feed-back circuit of the operational amplifier 90. The amplifier 9 has a log characteristic.

Accordingly, it is possible to obtain a suitable compensation circuit to make the characteristic of the modulator having a larger slope such as DG>about 50% to that having DG<5% by providing the circuit having an anti-log characteristic or a log characteristic on the previous stage of the compensation circuit shown in FIG. 1.

FIG. 11 shows radar equipment which is an applied example of the compensation circuit according to the present invention. More particularly, it is a diagram for explaining the equipment which employs FM-continuous wave (FM-CW).

The FM-CW radar equipment transmits a continuous wave signal which is frequency-modulated to a target, receives a reflected signal from the target, and detects the relative distance and velocity from the target according to a difference between the frequencies of the reflected signal and the transmitted signal.

In FIG. 11, reference numeral 2 is a voltage-controlled oscillator, of which output frequency is modulated by the modulation signal $V_0$ outputted from the modulation signal generator 11.

In the case where the frequency modulation is performed with a triangular wave, the signal transmitted from the voltage-controlled oscillator is as shown with $S_1$ in FIG. 12. A part of the transmitted signal $S_1$ is inputted to a mixer 13 as a local signal via a directional coupler 12 and the like.

The transmitted signal $S_1$ is reflected to the target, and is inputted to the mixer 13 as a received signal. The reflected received signal $R_1$ is as shown with the broken line in FIG. 12, as time delay occurs due to the distance to the target.

Further, a beat frequency $f_r$ of the transmitted signal $S_1$ and the received signal $R_1$ occurs due to the time delay as shown in FIG. 13. If $f_m$ is employed as the triangular wave frequency which is a frequency modulation signal, $\Delta f$ is used as a frequency shift width, and R is used as a distance to the target, the beat frequency $f_r$ is expressed as follows;

$$f_r = 4R \, f_m \cdot \Delta f / c \text{ (c means speed of light)}$$

Therefore, the distance R can be measured according to the beat frequency $f_r$.

In the case where the target is traveling with a fixed speed, or the radar equipment is traveling, a Doppler shift offset is added to the above-described received signal $R_1$ as shown in FIG. 14. Then, the beat frequency $f_r$ is as shown in FIG. 15. The Doppler frequency $f_d$ is piled up to the beat frequency $f_r$, and the direction shifts from positive to negative per each modulating cycle. Therefore, the beat frequency $f_r$ and the Doppler frequency $f_d$ can be measured to obtain the relative velocity and distance.

Meanwhile, in a real oscillator, as described in the above explanation of the prior art, the oscillating frequency is not varied linearly. For example, in the oscillator which employs a varactor diode, the relation between the voltage $V_T$ for supplying to the varactor diode and the oscillating frequency f becomes as shown in FIG. 16.

Accordingly, in the case where a triangular wave is employed as the voltage $V_T$ for supplying to the varactor diode, the variation of the oscillating frequency does not have linearity. Therefore, the transmitted signal frequency $S_1$ may not be as shown in FIGS. 12 and 14, but is as shown in FIG. 17.

The signal $S_1$ is reflected from the target and returned, so that the received signal is as shown with the broken line $R_1$ in FIG. 17, when the relative velocity is 0. Further, the beat frequency is as shown in FIG. 18 and extends over a wide range, so that it becomes difficult to measure the distance.

Similarly, in the case where the relative velocity is more than 0, the beat frequency extends over a wide range, so that the error in the measurement of the relative velocity and distance increases.

Accordingly, it is required to improve the linearity of the oscillator causing the conventional problems. The above-described problems can be solved by providing the compensation circuit according to the present invention to the input side of the oscillator.

FIG. 19 shows an embodiment applying the compensation circuit according to the present invention to the above-described radar equipment.

That is, the circuit is structured to insert the compensation circuit according to the present invention which is explained with regard to FIGS. 1 through 10, between the modulation signal generator 11 and the oscillator 2.

Further, FIG. 20 is an example of the circuit of the oscillator having the varactor diode 23. A resonator 22 is a circuit for resonating to the frequency of a specified band width, and it is formed of, for example, a strip line of $\lambda g/4$.

A GaAs FET 20 has a function for transmitting and receiving a signal to and from the resonator 22. A coupler 21 outputs the signal which appears to the drain of the GaAs FET as an oscillating frequency signal $V_0$.

The bias potential of the varactor diode 23 is changed by the control voltage $V_T$. Accordingly, the oscillating frequency can be varied by changing the varactor capacity. In this way, the oscillator 2 having the varactor diode 23 has a characteristic of non-linearity as described above.

Consequently, the linearity of the oscillator 2 can be improved by providing the compensation circuit 1 of the present invention according to a common principle described above.

As described according to the embodiments, the present invention brings the possibility to sensitively compensate, such as that an extent of an acceptable DG, for example, DG<30%, of the voltage-controlled oscillator is changed to a preferable DG, such as DG<5%. Similarly, in the case where the modulator has a characteristic having a larger slope, such as DG<50%, it is possible to make the DG to be less than 5%.

Further, it becomes possible to compensate for any slope at any position by the variation of a bias voltage, which is set according to the variation of the value of the resistor and bending points.

Furthermore, the present invention has been described with reference to embodiments, the invention is not limited to those embodiments. More particularly, all changes which fall within the meaning and range of equivalency of the claims are therefore intended to be embraced within the scope of the invention.

What is claimed is:

1. A compensation circuit operatively connected to an input of a voltage-controlled oscillator of which an oscillating frequency is controlled by a control voltage for compensating a differential gain of the voltage-controlled oscillator, the compensation circuit comprising:

a first resistor connected to an input side of the voltage-controlled oscillator in series;

a series circuit of a second resistor and a first diode connected to the input side of the voltage-controlled oscillator in parallel; and a first bias electric source for providing a forward bias voltage to the first diode.

2. A compensation circuit according to claim 1, further comprising:

a third resistor connected between the input side of the voltage-controlled oscillator and the first resistor;

a series circuit of a fourth resistor and a second diode connected to the input side of the voltage-controlled oscillator in parallel; and a second bias electric source of having a size different from that of the first bias electric source for providing a forward bias voltage to the second diode.

3. A compensation circuit according to claim 1, further comprising:
a series circuit of a third resistor and a second diode connected to the input side of the voltage-controlled oscillator in parallel; and
a second bias electric source having a size different from that of the first bias electric source for providing a forward bias voltage to the second diode.

4. A compensation circuit according to claim 1, further comprising:
a variable attenuator connected to one terminal of the first resistor; and
a variable-gain amplifier connected to another terminal of the first resistor.

5. A compensation circuit according to claim 1,
wherein the first bias electric source includes a diode biased in the forward direction and a variable resistor connected to the diode in parallel, a voltage between the terminals of the variable resistor biasing the first diode.

6. A compensation circuit according to claim 1, further comprising:
an anti-log amplifier having a transistor having a grounded base and a collector connected to the input side of an operational amplifier, and a resistor forming a feed back circuit of the operational amplifier.

7. A compensation circuit according to claim 1, further comprising:
a log amplifier having a transistor having a grounded base provided in feed back circuit of an operational amplifier having a resistor connected to the input side.

8. A modulator comprising:
a voltage-controlled oscillator having an oscillating frequency controlled by a control voltage; and
a compensation circuit connected to an input side of the voltage controlled oscillator, said compensation circuit having a first resistor connected to the input side of the voltage oscillator in series;
a series circuit of a second resistor and a first diode connected to the input side of the voltage-controlled oscillator in parallel; and
a first bias electric source for providing a forward bias voltage to the first diode.

9. A modulator according to claim 8,
wherein the compensation circuit further comprises:
a third resistor connected between the input side of the voltage-controlled oscillator and the first resistor;
a series circuit of a fourth resistor and a second diode connected to the input side of the voltage-controlled oscillator in parallel; and
a second bias electric source having a size different from that of the first bias electric source for providing a forward bias to the second diode.

10. A modulator according to claim 8,
wherein the compensation circuit further comprises a series circuit of a third resistor and a second diode connected to the input side of the voltage-controlled oscillator in parallel, and
a second bias electric source having a size different from that of the first bias electric source for providing a forward bias voltage to the second diode.

11. A modulator according to claim 8, further comprising:
a variable attenuator connected to one terminal of the first resistor; and
a variable-gain amplifier connected to another terminal of the first resistor.

12. A modulator according to claim 8,
wherein the first bias electric source includes a diode biased in a forward direction and a variable resistor connected to the diode in parallel, a voltage between the terminals of the variable resistor biasing the first diode.

13. A radar system comprising:
a modulation signal generator for outputting a modulation signal having a triangular waveform;
an oscillator for generating an oscillating signal having a frequency corresponding to the size of the modulation signal outputted from the modulation signal generator;
a transmitting antenna for transmitting the oscillating signal outputted from the oscillator via a directional coupler;
a receiving antenna for receiving a reflected signal of the oscillating signal transmitted from the transmitting antenna;
a mixer for mixing a reflected signal received from the receiving antenna and the oscillating signal outputted from the oscillator and for outputting a beat signal corresponding to a difference of frequencies between the oscillating and reflected signals; and
a compensation circuit which is connected between the modulation signal generator and the oscillator, said compensation circuit having
a first resistor connected to the input side of the oscillator in series;
a series circuit of a second resistor and a first diode connected to the input side of the oscillator in parallel, and
a first bias electric source for providing a forward bias voltage to the first diode.

14. A radar system according to claim 13, further comprising:
a third resistor connected between the input side of the oscillator and the first resistor;
a series circuit of a fourth resistor and a second diode connected to the input side of the voltage-controlled oscillator; and
a second bias electric source having a size different from that of the first bias electric source for providing a forward bias voltage to the second diode.

15. A radar system according to claim 13, further comprising:
a series circuit of a third resistor and a second diode connected to the input side of the oscillator in parallel; and
a second bias electric source having a size different from that of the first bias electric source for providing a forward bias voltage to the second diode.

16. A radar system according to claim 13, further comprising:
a variable attenuator connected to one terminal of the first resistor; and
a variable-gain amplifier connected to another terminal of the first resistor.

17. A radar system according to claim 13,
wherein the first bias electric source has a diode biased in the forward direction and a variable resistor connected to the diode in parallel, a voltage of the variable resistor biasing the first diode.

18. A radar system according to claim 13, further comprising:

an anti-log amplifier having a transistor having a grounded base connected input side of an operational amplifier, and a resistor within a feed back circuit of the operational amplifier.

19. A radar system according to claim 13, further comprising:

a log amplifier which includes having a transistor having a grounded base and provided in a feed back circuit of an operational amplifier; and a resistor on an input side of the operational amplifier.

* * * * *

UNITED STATES PATENT AND TRADEMARK OFFICE
CERTIFICATE OF CORRECTION

PATENT NO. : 5,576,713
DATED : November 19, 1996
INVENTOR(S) : Suzuki et al

It is certified that error appears in the above-indentified patent and that said Letters Patent is hereby corrected as shown below:

Column 2, line 10, delete "drawback", insert --in--.
Column 6, line 25, delete "Di" and insert -- $D_1$ --.
Column 6, line 37, delete "$D_1$" and insert --$D_2$--.
Column 9, line 34, delete "feed back" and insert --a feed back--.

Signed and Sealed this

Fourteenth Day of October, 1997

Attest:

BRUCE LEHMAN

Attesting Officer

Commissioner of Patents and Trademarks